United States Patent
Daoud

[11] Patent Number: 6,129,575
[45] Date of Patent: *Oct. 10, 2000

[54] TESTING SYSTEM FOR A CONNECTOR WITH A SELF-SEALING CONNECTOR HOUSING

[75] Inventor: Bassel H. Daoud, Parsippany, N.J.

[73] Assignee: Lucent Technologies Inc., Murray Hill, N.J.

[*] Notice: This patent is subject to a terminal disclaimer.

[21] Appl. No.: 09/217,095

[22] Filed: Dec. 21, 1998

[51] Int. Cl.[7] .............................. H01R 4/24; H01R 4/26; H01R 11/20
[52] U.S. Cl. ........................ 439/426; 439/587; 439/912; 324/761
[58] Field of Search ..................... 439/426, 427, 439/387, 912, 261, 272, 274; 324/761, 72.5, 754

[56] References Cited

U.S. PATENT DOCUMENTS

| | | | |
|---|---|---|---|
| 3,571,779 | 3/1971 | Collier | 439/587 |
| 3,611,264 | 10/1971 | Ellis | 439/403 |
| 3,885,850 | 5/1975 | Witte et al. | 439/346 |
| 3,918,784 | 11/1975 | Lemke et al. | 439/70 |
| 4,232,924 | 11/1980 | Kline et al. | 439/74 |
| 4,662,699 | 5/1987 | Vachhani et al. | 439/395 |
| 4,793,823 | 12/1988 | Cozzens et al. | 439/409 |
| 4,947,115 | 8/1990 | Siemon et al. | 324/761 |
| 5,240,432 | 8/1993 | Daoud | 439/417 |
| 5,614,820 | 3/1997 | Aoyama et al. | 324/158.1 |
| 5,637,011 | 6/1997 | Meyerhoefer et al. | 439/409 |
| 5,860,829 | 1/1999 | Hower et al. | 439/417 |

OTHER PUBLICATIONS

Technical Data Sheet of A.C. Egerton Limited, related to Mini Rocker Cross Connection Cabinets.

Primary Examiner—Brian Sircus
Assistant Examiner—Michael C. Zarroli
Attorney, Agent, or Firm—Stroock & Stroock & Lavan LLP

[57] ABSTRACT

A connector testing system includes a bridge clip having a body and at least one test lead having a fixed end connected to the body, a connector having a top portion and a housing having at least one test channel formed therein, and at least one terminal strip disposed within the housing. A portion of the terminal strip is disposed within the at least one test channel. A first flap is connected to the housing for substantially sealing the test channel when the first flap is in a first position and for sealing the test channel and for biasing the bridge clip test lead against the connector at a second position.

25 Claims, 3 Drawing Sheets

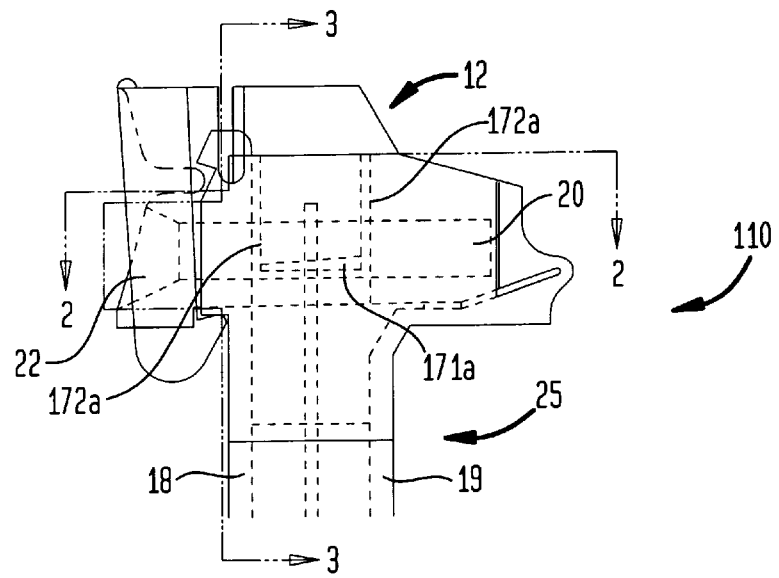
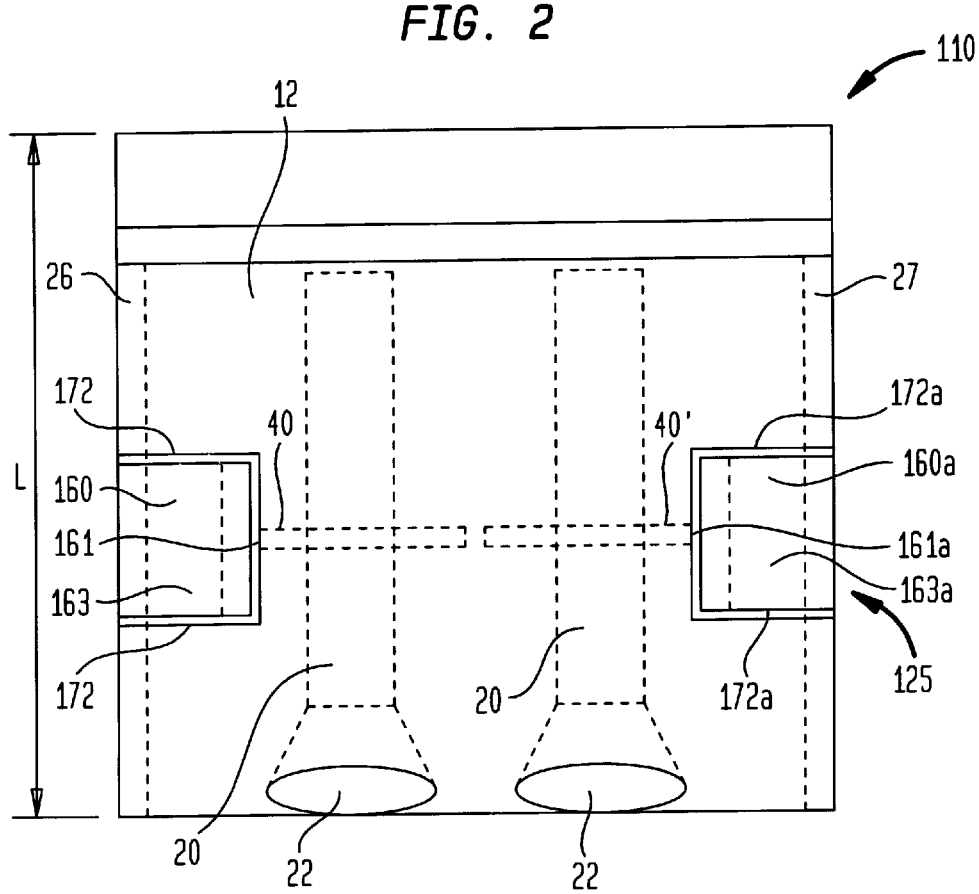

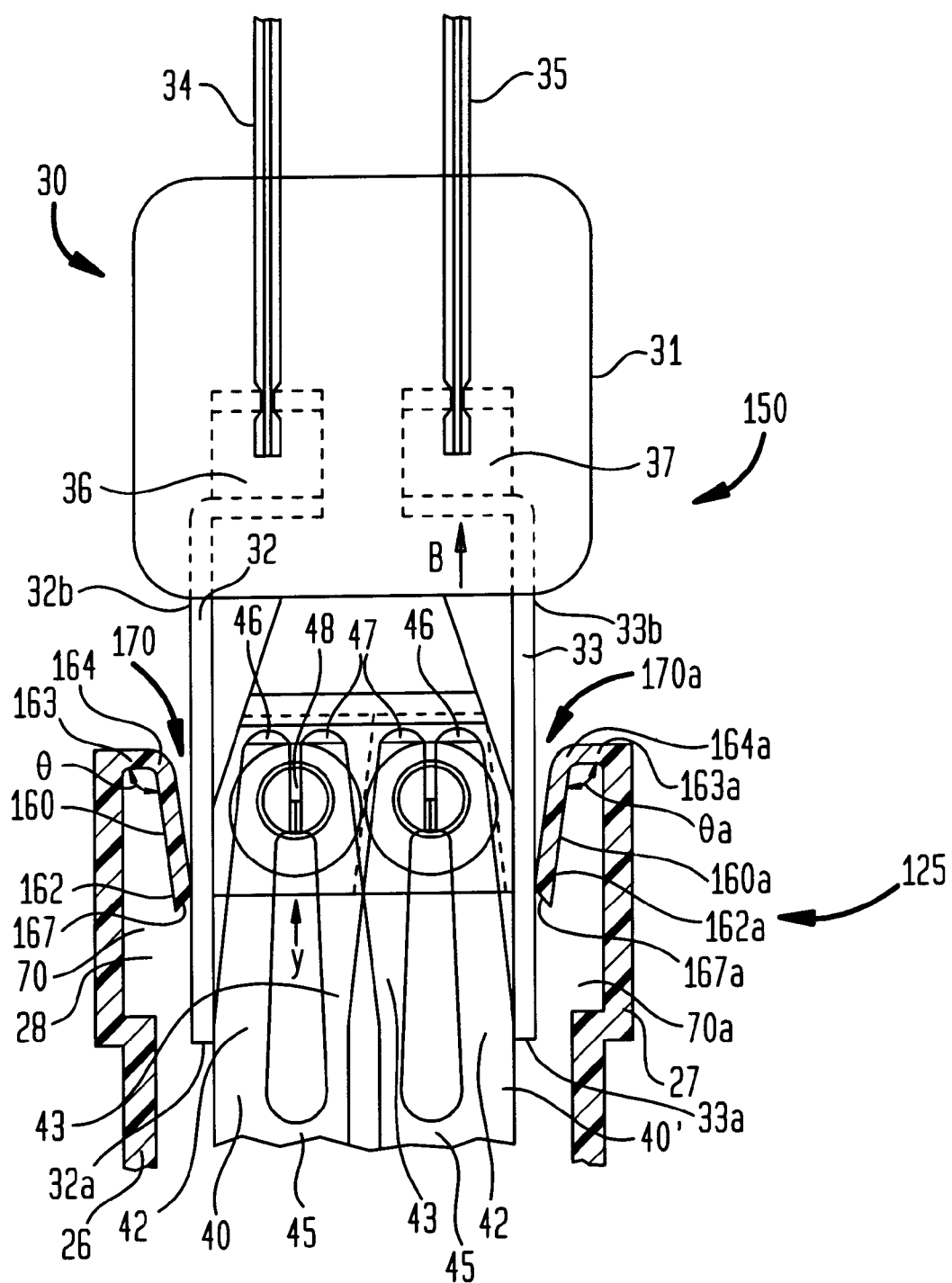

TESTING SYSTEM FOR A CONNECTOR WITH A SELF-SEALING CONNECTOR HOUSING

FIELD OF THE INVENTION

This invention relates generally to the field of telephone wire connectors and distribution systems, and specifically to a connector and a test device for testing wiring connected to the connector.

BACKGROUND OF INVENTION

In a telephone network, a network cable from the central office is connected to a building entrance protector (BEP) located at the customer site, where the individual telephone lines are broken out line-by-line. The network cable, which consists of a plurality of tip-ring wire pairs that each represent a telephone line, is typically connected to a connector block that forms a part of the BEP. Such connectors may be, for example, mini rocker tool-less insulation displacement (IDC)-type connectors, such as, for example, those sold by A.C. Egerton, Ltd. Other connectors used for telephony wiring applications are described in U.S. Pat. No. 4,662,699 to Vachhani et al., dated May 5, 1987, and in U.S. Pat. No. 3,611,264 to Ellis, dated Oct. 5, 1971.

The customer telephone equipment is coupled through such an IDC connector to, for example, a central office telephone line. The mini-rocker connector generally has a test channel that includes two wire insertion holes and a bottom section that houses a pair of terminal strips. The wire insertion holes each accommodate one wire of a tip-ring wire pair. The test channel pivots about a generally hinged fixed axis located on the side opposite the wire insertion holes and has a movable clasp for maintaining the test channel in its closed position.

To open the top portion, a user releases the clasp member and pivots the top portion to its open position. When the top portion is in its open position, the terminal strips do not intersect the wire insertion channels, but when the top portion is in its closed position, the terminal strips intersect the wire insertion channels. Therefore, to establish an electrical connection between the wires and the terminal strips a user first opens the top portion (i.e., pivots the top portion to its open position), inserts the pair of wires, and then closes the top portion. Upon closing the top portion of the connector, the wires are brought into electrical contact with the terminal strips. To remove the wires and/or break the electrical connection, the process is reversed.

To verify the integrity of a telephone line, the telephone line may be tested at the connector using a bridge clip. The bridge clip includes a body, at least a first test lead and a second test lead connected to the body, and lead wires for connecting the first and second test leads to a testing device, such as a volt meter or telephone test set. The base section of the connector includes two test channels, each located adjacent a terminal strip and sized to accommodate a test lead of a bridge clip. The test leads are spaced apart and constructed to be received within the test channels.

Testing is typically performed by inserting the test leads of a bridge clip into the test channels of the base section of the connector until each of the test leads contacts an outside edge of one of the pair of terminal strips housed within the base section to make an electrical connection. If a current flow is detected, or a dial tone is heard, depending on the test methodology, then a loop condition exists for that particular tip-ring wire pair, and the integrity of the line is verified. If no loop condition is found, either an electrical open or short exists in the telephone line or a connection to or in the terminal block is defective.

The prior art connector has no means of automatically closing and sealing the test channels of the connector. While the prior art connector works for its intended purpose, the prior art connector permits dust, dirt, moisture or other contaminants to enter the interior of the connector via the open channels, which could have a detrimental effect on the performance of the connector. Such contaminants can hinder the performance of the connector by mixing with the gel within the connector interior portion and preventing the establishment of a proper connection between the test device and the terminal strips and by causing the degradation of connector components.

SUMMARY OF THE INVENTION

The present invention is directed at overcoming shortcomings in the prior art. Generally speaking, in accordance with the present invention, a connector testing system for an insulation displacement connector comprises a connector having a top portion and a housing, a flap connected to the housing, at least a first terminal strip disposed within the connector, and a bridge clip having a body and at least a first test lead connected thereto. The housing encloses a connector interior portion.

To facilitate testing of connections made through the connector, at least one test channel is formed in the housing. A portion of the terminal strip is disposed within the test channel so as to permit a test lead to be inserted into the test channel to make electrical contact with the terminal strip. Preferably, the housing includes two test channels, each test channel having a portion of a respective terminal strip disposed therein.

As described above, the connector includes a flap connected to the housing. The flap may be formed with the housing or a housing wall may act as the flap. The flap includes a first flap having a first flap fixed end connected to the housing, and a first flap free end. The first flap is preferably connected to the housing at a first flap connected end, and is movable between a first position, where the first flap free end preferably contacts the test channel to substantially seal the test channel and the interior of the connector from outside contaminants, and a second position, where the first flap permits a test lead to enter the test channel to make contact with the terminal strip. In the first position, the first flap and the test channel of the connector form a first insertion channel that serves to assist the craftsperson in guiding the test lead to the test channel. In the second position, the first flap free end biases a portion of the test lead free end against the terminal strip. In this manner, the testing system provides a reliable contact between the bridge clip and a terminal strip of the connector during a testing procedure.

In a preferred embodiment, the flap includes a second flap having a second flap fixed end connected to the housing at a position substantially opposite the position at which the first flap is connected to the housing, and a second flap free end. Similarly to the first flap, the second flap is movable between a first position where the second flap free end preferably contacts the test channel to seal the second test channel and the interior of the connector from outside contaminants, and a second position where the second flap permits a test lead to enter the test channel to make contact with the terminal strip. In the first position, the second flap and the test channel of the connector form a second insertion channel that serves to assist the craftsperson in guiding the test lead to the test channel.

Further, in the preferred embodiment, the bridge clip includes two test leads with each test lead capable of moving a respective test flap to the second position, entering the connector interior portion through a respective test channel and making contact with a respective terminal strip.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views:

FIG. 1 is a side elevational view of a connector constructed in accordance with the present invention;

FIG. 2 is a top plan view of the connector of FIG. 1 taken along line 2—2;

FIG. 4 is a front sectional view of the connector testing system including the connector of FIG. 2 with a bridge clip completely inserted into the connector with the flaps in the second position.

DETAILED DESCRIPTION OF THE PREFERRED EMBODIMENTS

Figure 3:
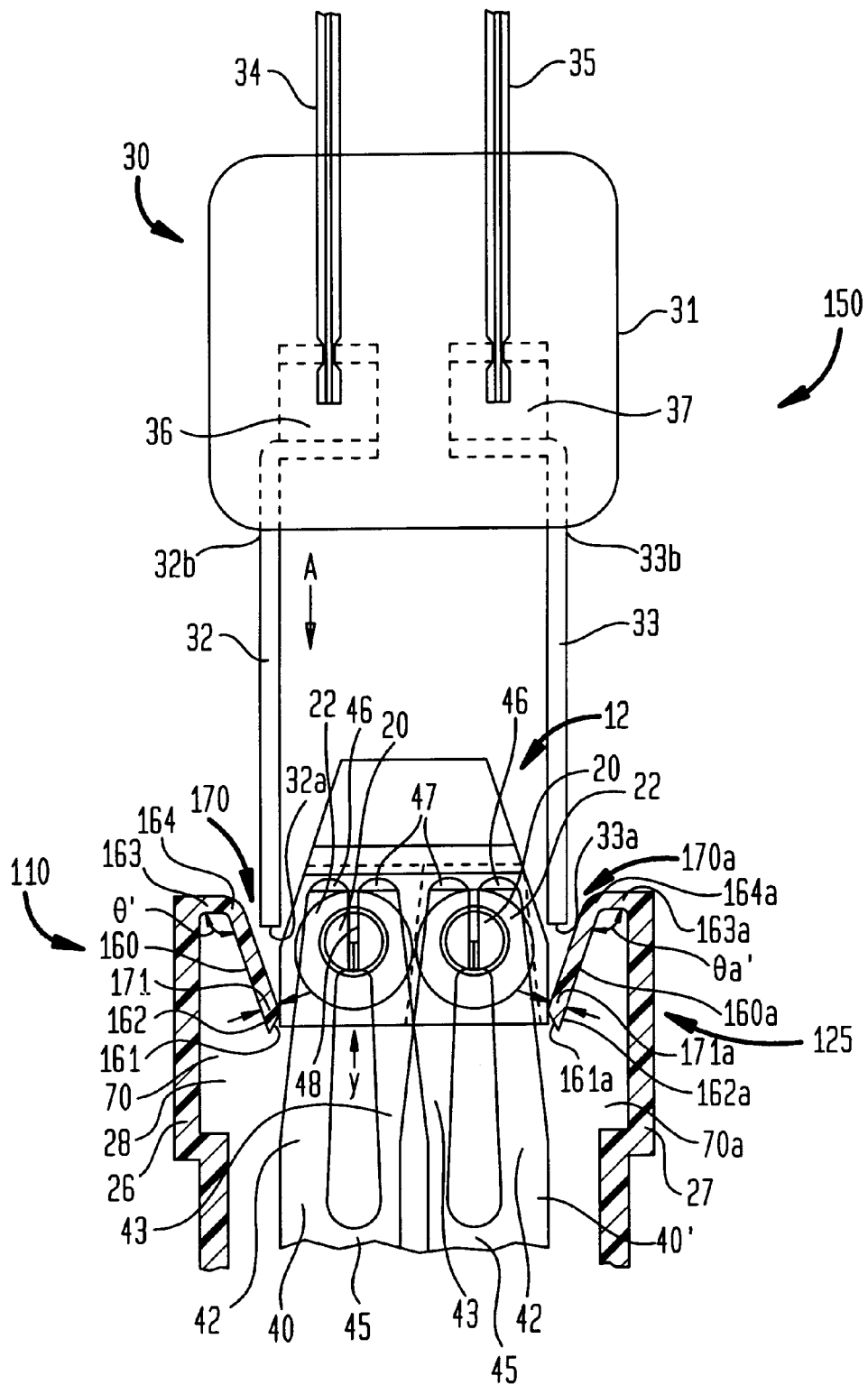
FIG. 3 is a front sectional view of the connector testing system including the connector of FIG. 1 taken along the line 3—3 with a bridge clip being inserted into the connector with the flaps in the first position.

Reference is made to FIGS. 3 and 4, which illustrate a connector testing system of the present invention, generally indicated as 150. Connector testing system 150 includes a bridge clip 30 and a connector 110. Reference is also made to FIGS. 1 and 2, which illustrate connector 110 of the present invention. Connector 110 of connector testing system 150 includes a top portion 12 and a housing 125. Housing 125 includes a first side wall 26, a second side wall 27, a front wall 18 and a rear wall 19, extending between side walls 26, 27, and a bottom wall (not shown) positioned substantially perpendicular to side walls 26, 27, front wall 18 and rear wall 19 and extending therebetween. Top portion 12 of connector 110 has at least one wire insertion channel 20. Generally, top portion 12 of connector 110 comprises two wire insertion channels 20 as known in the art, one for each wire of a tip-ring pair. Although the discussion here will focus on one wire insertion channel, top portion 12 of connector 110 may contain a plurality of wire insertion channels 20. Each wire insertion channel 20 includes an entrance aperture 22 and wire insertion channel 20 is constructed so as to be capable of receiving and holding any ordinary telephone wire (not shown) of a type known in the art.

Top portion 12 of connector 110 also includes terminal strip-receiving portions (not shown) which are constructed to accept terminal strips 40, 40'. Connector 110 may include one or more terminal strips. Terminal strips 40, 40' are disposed within housing 125 of connector 110. Each terminal strip 40, 40' has a longitudinal axis shown by arrow Y in FIG. 3. Terminal strip 40 includes an outer arm 42, an inner arm 43 and a wire wrap terminal (not shown). Outer arm 42 has an outer tip 46 and inner arm 43 has an inner tip 47.

Outer tip 46 and inner tip 47 form a wire gripping region 48 for retaining an electrical conductor (not shown) that has been inserted into wire insertion holes 20 of top portion 12 of connector 110. Terminal strip 40 includes a terminal base 45 formed by outer arm 42 and inner arm 43 at the end opposite outer tip 46 and inner tip 47. Terminal base 45 further extends into wire wrap terminal (not shown). Terminal strips 40, 40' are shown in a side-by-side configuration in FIG. 2 for purposes of example. However, as is shown in FIG. 3, terminal strips 40, 40' are typically spaced apart in a direction along the length of the wire insertion holes 20.

Terminal strips 40, 40' may be formed of any commonly known conductive metal known in the art and suitable for use in such terminals, such as, for example, platinum washed phosphor bronze, or beryllium-copper alloy or other metal or alloy combining good electrical conductivity with sufficient mechanical strength and resilience.

To facilitate testing of connections made through the connector, a first test channel 70 is formed between side wall 26, front wall 18, rear wall 19 and bottom (not shown), and a second test channel 70a is formed between side wall 27, front wall 18, rear wall 19 and bottom (not shown). A portion of terminal strip 40 is disposed within first test channel 70, and a portion of terminal strip 40' is disposed within second test channel 70a.

Referring to FIGS. 1–3, housing 125 of connector 110 includes a first flap 160. In a preferred embodiment, connector 110 includes first flap 160 and a second flap 160a. The construction of second flap 160a is preferably identical to that of first flap 160. While the discussion here will focus on first flap 160, the same discussion applies to the construction, use and operation of second flap 160a. Connector 110 may contain a plurality of flaps as a matter of application-specific design choice.

In an alternative embodiment, the flap can consist of a side wall of the connector that itself can be biased against the top portion. In such an embodiment, the side wall would include a projection on the upper inside surface of the side wall to space the side wall from the top portion and form a test channel. Further, a portion of the side wall would not be connected to the front or rear wall of the connector housing such that the side wall could flex to permit a test lead to be inserted between the projection and the top portion and into the test channel.

First flap 160 may extend for substantially the length of connector 110 which length is depicted by L in FIG. 2. However, in a preferred embodiment, as shown in FIGS. 1 and 2, first flap 160 is limited by a first flap boundary 172, which forms a portion of top portion 12. The length of first flap 160 may be varied as required by a user of ordinary skill in the art, as a matter of application-specific design choice. First flap 160 has a first flap free end 162 and a first flap connected end 163, which is connected to housing 125. First flap free end 162 has a first flap tip length 171. Similarly, second flap 160a has a second flap tip length 171a as shown in FIGS. 1 and 3. First flap 160 is movable between a first position, as illustrated in FIG. 3, and a second position, as illustrated in FIG. 4. With first flap 160 in the first position, first flap free end 162 preferably contacts top portion 12 at a first flap contact point 161. First flap 160 also includes a first flap bend point 164 which is located between first flap free end 162 and first flap connected end 163. With first flap 160 in the first position, first flap 160 is bent at a first flap first angle 165 about first flap bend point 164, as illustrated in FIG. 3.

First flap 160 and top portion 12 define a first insertion channel 170 therebetween. In a preferred embodiment, wherein housing 125 includes a second flap 160a, second flap 160a and top portion 12 of connector 110 define a second insertion channel 170a.

Referring to FIG. 3, bridge clip 30 of connector testing system 150 includes a body 31 a first test lead 32, a second test lead 33 and electrical conductors 34, 35. First test lead 32 and conductor 34 are connected to body 31 at connection region 36, and second test lead 33 and conductor 35 are connected to body 31 at connection region 37. First test lead 32 has a first end 32a and a second end 32b. Second end 32b of first test lead 32 is connected to body 31, whereas first end 32a of first test lead 32 is unattached. Similarly, second test lead 33 has a first end 33a and a second end 33b. Second end 33b of second test lead 33 is connected to body 31, whereas first end 33a of second test lead 33 is unattached. Electrical conductors 34, 35 are connected to a testing device (not shown). Thus, first test lead 32 and second test lead 33 are connected to the testing device through connection regions 36, 37 and electrical conductors 34, 35, respectively. First test lead 32 and second test lead 33 are preferably straight, flat blades. However, test leads 32, 33 may be cylindrical in shape as a matter of application-specific design choice.

In use, testing of the electrical connection of terminal strips 40, 40' of connector 110 is performed by inserting first test lead 32 and second test lead 33 of bridge clip 30 into first insertion channel 170 and second insertion channel 170a, respectively. This is performed by the user moving bridge clip 30 in a direction toward connector 110 as illustrated by arrow A in FIG. 3. Upon entering first insertion channel 170 and second insertion channel 170a, first end 32a of first test lead 32 and first end 33a of second test lead 33 displace first flap 160 and second flap 160a, respectively, such that first flap 160 no longer contacts top portion 12 at first flap contact point 161 and second flap 160a no longer contacts top portion 12 at second flap contact point 161a, respectively. Flaps 160, 160a are pushed into their second position, as illustrated in FIG. 4, whereby the angle at first bend point 164 and second bend point 164a is decreased to first flap second angle 166 and second flap second angle 166a, respectively. First test lead 32 and second test lead 33 of bridge clip 30 travel in the direction illustrated by arrow A of FIG. 3 until first test lead 32 and second test lead 33 make contact with outer arms 42 of terminal strips 40, 40'. In this position, an electrical connection is made between electrical conductors 34, 35 and terminal strips 40, 40' of connector 110. Thus, if a current flow is detected, or a dial tone is heard, depending on the test methodology, then a loop condition exists for the tip-ring wire pair represented by connector 110 in FIGS. 3 and 4. Thus, the integrity of the telephone line can be verified. On the other hand, if no loop condition is found, either an electrical open or short exists in the telephone line or a connection to or in the terminal lock is defective.

With flaps 160, 160a in the second position, as illustrated in FIG. 4, first flap free end 162 and second flap free end 162a are preferably biased to first test lead 32 and second test lead 33, respectively. That is, because first flap 160 is resiliently connected to housing 125, the spring force of flap 160 strain-relieves first test lead 32 by biasing first flap free end 162 against the outer surface of test lead 32 at contact point 167 to prevent the inadvertent withdrawal of test lead 32 and effectively seal connector interior portion 28. Thus, first test channel 70 is insulated from the exterior of connector 110 thereby preventing the entry of any dust, water or dirt into the connector interior portion 28. Similarly because second test lead 160a is resiliently connected to housing 125, the spring force of flap 160a strain-relieves second test lead 33 by biasing second flap free end 162a against the outer surface of test lead 33 at contact point 167a to prevent the inadvertent withdrawal of test lead 33 and effectively seal connector interior portion 28, thereby preventing the entry of any dust, water or dirt into connector interior portion 28. Of course, one skilled in the art can construct flaps 160 and 160a so as to apply no strain relief to test leads 32 and 33.

When bridge clip 30 is subsequently moved in a direction so as to remove first test lead 32 and second test lead 33 from first test channel 70 and second test channel 70a, respectively, as illustrated by arrow B in FIG. 4, first flap 160 and second flap 160a are returned to their original, first positions, as illustrated in FIG. 3. In this position, first flap free end 162 and second flap free end 162a of first flap 160 and second flap 160a, respectively, contact top portion 12 at first flap contact point 161 and second flap contact point 161a, respectively. Thus, throughout the entire testing procedure, connector interior portion 28 is effectively sealed off from the exterior. This insulation of the connector interior portion 28 from any dust, dirt, moisture or other exterior contaminant provides a more reliable electrical connection between bridge clip 30 and terminal strips 40, 40'.

In a preferred embodiment, first flap second angle $\theta$, and second flap second angle $\theta a$, are approximately equal to 90°, although the person of skill will recognize that the precise angles $\theta$, $\theta a$, and the dimensions of first flap 160 and second flap 160a are a matter of application-specific design requirements and thus readily adaptable by the person of skill utilizing the teachings herein. Thus, first flap second angle $\theta$ and second flap second angle $\theta a$ may be, by way of non-limiting example, about 60° to about 120°. Similarly, first flap first angle $\theta$ and second flap first angle $\theta a$ may be, by way of non-limiting example, about 60° to about 120°. However, in any one implementation, first flap second angle 166 will always be less than first flap first angle $\theta$. Similarly, for the same implementation, second flap second angle $\theta a$ will always be less than second flap first angle $\theta a$.

Top portion 12 and housing 125, including flaps 160, 160a, may be formed of any art-recognized material having the proper insulating and mechanical properties. Preferably, plastic is employed. The specific materials used in constructing top portion 12 and housing 125 are an application-specific matter of design choice within the knowledge of the person of skill in the art. Flaps 160, 160a do not have to be constructed of the same material as housing 125 and can be constructed of any flexible material, such as rubber, a metal, or any other suitable material known of a person of skill in the art. Further, the connector of the present invention may be used in a wiring enclosure, such as, for example, a Building Entrance Protector (BEP) or Network Interface Unit (NIU).

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A connector testing system, comprising:
    a bridge clip having a body and at least one test lead having a test lead fixed end connected to the body on one end of said test lead and a test lead free end on the other end of said test lead;

a connector having a top portion and a housing having at least one test channel formed therein;

at least one terminal strip disposed within the housing and positioned alongside said test channel, the terminal strip having an inner side and an outer side and a portion of said outer side disposed within the test channel such that said test lead is capable of being disposed within said channel and said test lead free end is capable of contacting said outer side of said terminal strip; and a first flap connected to the housing for sealing the at least one test channel when the first flap is in a first position and a second position.

2. The connector testing system of claim 1, wherein the first flap secures the bridge clip against the connector at the second position.

3. The connector testing system of claim 1, wherein the first flap has a first flap fixed end and a first flap free end, the first flap fixed end being resiliently connected to said housing.

4. The connector testing system of claim 1, wherein the first flap fixed end is integrally formed with the housing.

5. The connector testing system of claim 3, wherein the first flap free end contacts the top portion to seal the first test channel when the first flap is in the first position.

6. The connector testing system of claim 3, wherein the first flap free end forms an insertion channel with the top portion of the connector when the first flap is in the first position.

7. The connector testing system of claim 1, wherein the first flap free end biases the at least one test lead against the at least one terminal strip when the first flap is in the second position.

8. The connector testing system of claim 3, wherein the first flap is resiliently moveable between the first position where the first flap free end contacts the top portion to seal the at least one test channel and the second position where the first flap free end biases the at least one test lead against the at least one terminal strip.

9. The connector testing system of claim 1, wherein said first flap is oriented at a first angle in the first position and the first flap is oriented at a second angle in the second position such that said first angle is greater than said second angle.

10. The connector testing system of claim 9, wherein said first flap second angle is approximately equal to 90°.

11. The connector testing system of claim 9, wherein said first flap second angle is more than 90°.

12. The connector testing system of claim 9, wherein said first flap second angle is less than 90°.

13. The connector testing system of claim 9, wherein said first flap second angle is in a range of about 60° to 120°.

14. The connector testing system of claim 1, wherein said connector is disposed on a connector block.

15. The connector testing system of claim 1, wherein said connector is disposed in a wiring enclosure.

16. A connector testing system, comprising:

a bridge clip having a body and a first test lead and a second test lead, the first test lead having a first test lead fixed end connected to the body and a first test lead free end, the second test lead having a second test lead fixed end connected to the body and a second test lead free end;

a connector having a top portion and a housing having a first test channel formed therein and a second test channel formed therein;

a first terminal strip disposed within the housing and positioned alongside said first test channel, the first terminal strip having a first inner side and a first outer side and a portion of said first terminal strip disposed within the first test channel such that said first test lead is capable of being disposed within said first test channel and said first test lead free end is capable of contacting said first outer side of said first terminal strip;

a second terminal strip disposed within the housing and positioned alongside said second test channel, the second terminal strip being spaced apart from the first terminal strip and having a second inner side and a second outer side and a portion of said second terminal strip disposed within the second test channel such that said second test lead is capable of being disposed within said second test channel and said second test lead free end is capable of contacting said second outer side of said second terminal strip;

a first flap having a first flap fixed end and a first flap free end, the first flap fixed end being connected to said housing; and a second flap having a second flap fixed end and a second flap free end, the second flap fixed end being connected to said housing at a position spaced apart from said first flap fixed end; the first flap and second flap sealing the first and second test channels when the first and second flaps are in the first position and sealing the first and second test channels and securing the bridge clip to the connector when the first and second flaps are in the second position.

17. The connector testing system of claim 16, wherein the first flap has a first flap fixed end and a first flap free end, the first flap fixed end being connected to said housing, and the second flap has a second flap fixed end and a second flap free end, the second flap fixed end being connected to said housing at a position spaced apart from said first flap fixed end.

18. The connector testing system of claim 17, wherein the first flap free end contacts the top portion of the connector to seal the first test channel and the second flap free end contacts the top portion to seal the second test channel when the first and second flaps are in the first position.

19. The connector testing system of claim 17, wherein the first free end forms a first insertion channel with the top portion of the connector and the second free end forms a second insertion channel with the top portion when the first and second flaps are in the first position.

20. The connector testing system of claim 17, wherein the first flap biases the first test lead against the first terminal strip and the second flap biases the second test lead against the second terminal strip when the first and second flaps are in the second position.

21. The connector testing system of claim 16, wherein said connector is disposed on a connector block.

22. The connector testing system of claim 16, wherein said connector is disposed in a wiring enclosure.

23. A method of testing an electrical connection of a connector, comprising the steps of:

providing a connector that includes a top portion and a housing having a test channel formed therein, and a flap resiliently connected to the connector, the flap sealing the test channel and forming an insertion channel with the top portion of the connector when the flap is in a first position;

inserting a test lead into the insertion channel to thereby displace the flap and permit the test lead access to the test channel;

inserting the test lead into the test channel until at least a portion of the test lead is disposed within the test channel whereby the test lead contacts a terminal strip positioned alongside said test channel on an outer portion of said terminal strip and the flap moves to a second position to secure the test lead to the connector; and testing the electrical connection of the connector.

24. The method of claim 23, comprising the step of pulling the test lead until the flap moves from the second position to a third position to permit the test lead to be withdrawn from the test channel.

25. The method of claim 24, comprising the step of withdrawing the test lead by further pulling on the test lead until the test lead no longer contacts the flap, whereupon the flap resiliently moves from the third position to the first position to seal the test channel.

* * * * *